United States Patent
Cox et al.

(10) Patent No.: US 10,242,727 B2
(45) Date of Patent: Mar. 26, 2019

(54) REDUCTION OF POWER CONSUMPTION IN MEMORY DEVICES DURING REFRESH MODES

(71) Applicant: Intel Corporation, Santa Clara, CA (US)

(72) Inventors: Christopher E. Cox, Placerville, CA (US); Kuljit S. Bains, Olympia, WA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/983,009

(22) Filed: May 17, 2018

(65) Prior Publication Data
US 2018/0336943 A1   Nov. 22, 2018

Related U.S. Application Data

(60) Division of application No. 15/354,200, filed on Nov. 17, 2016, now Pat. No. 9,984,737, which is a
(Continued)

(51) Int. Cl.
*G11C 7/00* (2006.01)
*G11C 11/406* (2006.01)
(Continued)

(52) U.S. Cl.
CPC ...... *G11C 11/40615* (2013.01); *G11C 11/409* (2013.01); *G11C 11/4074* (2013.01);
(Continued)

(58) Field of Classification Search
CPC .............. G11C 5/147; G11C 7/00; G11C 7/08
(Continued)

(56) References Cited

U.S. PATENT DOCUMENTS

| 5,867,438 A | 2/1999 | Nomura et al. |
| 6,215,714 B1 | 4/2001 | Takemae et al. |

(Continued)

FOREIGN PATENT DOCUMENTS

WO   2012027250 A1   3/2012

OTHER PUBLICATIONS

Korean and English Translation of Korean Fourth Office Action for Patent Application No. 10-2016-7036307, dated May 30, 2018, 6 pages.

(Continued)

*Primary Examiner* — Jason Lappas
(74) *Attorney, Agent, or Firm* — Compass IP Law PC

(57) ABSTRACT

Devices, systems, and methods include an active mode to accommodate read/write operations of a memory device and a self-refresh mode to accommodate recharging of voltage levels representing stored data when read/write operations are idle. At least one register source provides a first voltage level and a second voltage level that is less than the first voltage level. With such a configuration, during the active mode, the memory device operates at the first voltage level as provided by the at least one register source, and during the self-refresh mode, the memory device operates at the second voltage level as provided by the at least one register source.

20 Claims, 2 Drawing Sheets

Related U.S. Application Data continuation of application No. 15/181,358, filed on Jun. 13, 2016, now Pat. No. 9,536,588, which is a division of application No. 13/997,959, filed as application No. PCT/US2012/030657 on Mar. 27, 2012, now Pat. No. 9,396,784.

(51) Int. Cl.

| | | |
|---|---|---|
| *G11C 11/4074* | (2006.01) | |
| *G11C 11/4096* | (2006.01) | |
| *G11C 11/409* | (2006.01) | |
| *G11C 7/08* | (2006.01) | |
| *G11C 16/34* | (2006.01) | |
| *G11C 16/26* | (2006.01) | |
| *G11C 16/10* | (2006.01) | |
| *G11C 16/04* | (2006.01) | |
| *G11C 16/24* | (2006.01) | |

(52) U.S. Cl.
CPC ..... *G11C 11/4096* (2013.01); *G11C 11/40611* (2013.01); *G11C 7/00* (2013.01); *G11C 7/08* (2013.01); *G11C 16/0483* (2013.01); *G11C 16/10* (2013.01); *G11C 16/24* (2013.01); *G11C 16/26* (2013.01); *G11C 16/3418* (2013.01); *G11C 2211/4065* (2013.01); *G11C 2211/4068* (2013.01)

(58) Field of Classification Search
USPC .............................. 365/189.07, 189.09, 207
See application file for complete search history.

(56) References Cited

U.S. PATENT DOCUMENTS

| | | |
|---|---|---|
| 7,266,031 B2 | 9/2007 | Kim et al. |
| 7,800,431 B2 | 9/2010 | Chu |
| 2003/0067824 A1 | 4/2003 | Janzen |
| 2005/0246558 A1 | 11/2005 | Ku |
| 2006/0171231 A1 | 8/2006 | Song |
| 2008/0002485 A1 | 1/2008 | Kim |
| 2008/0018381 A1 | 1/2008 | Shin |
| 2008/0080286 A1 | 4/2008 | Tomita |
| 2008/0298152 A1 | 12/2008 | Ito et al. |
| 2009/0219767 A1 | 9/2009 | Lines et al. |
| 2013/0114353 A1* | 5/2013 | Vogelsang ............... G11C 7/08 365/189.07 |

OTHER PUBLICATIONS

Korean and English Translation of Korean Office Action for Patent Application No. 10-2018-7018697, dated Jul. 16, 2018, 4 pages.
English Translation of the Notice of Preliminary Rejection, Application No. 10-2016-7036307, dated Apr. 4, 2017, 3 pages.
English Translation of the Notice of Preliminary Rejection, Patent Application No. 10-2016-7036307, dated Sep. 20, 2017, 2 pages.
English Translation of the Notice of Preliminary Rejection, Patent Application No. 10-2016-7036307, dated Nov. 23, 2017, 4 pages.
Final Office Action for U.S. Appl. No. 15/354,200, dated Oct. 20, 2017, 13 pages.
International Search Report dated Nov. 20, 2012 in corresponding International Patent Application PCT/US2012/030657, total of 3 sheets.
Notice of Allowance for Korean Patent Application No. 10-2014-7027306, dated Sep. 27, 2016, 2 pages.
Notice of Allowance for U.S. Appl. No. 13/997,959, dated Mar. 7, 2016, 9 pages.
Notice of Allowance for U.S. Appl. No. 13/997,959, dated May 11, 2015, 9 pages.
Notice of Allowance for U.S. Appl. No. 15/181,358, dated Aug. 16, 2016, 8 pages.
Notice of Preliminary Rejection for Korean Patent Application No. 10-2014-7027306, dated Mar. 22, 2016, 5 pages.
Office Action for U.S. Appl. No. 13/997,959, dated Oct. 28, 2015, 9 pages.
Office Action for U.S. Appl. No. 15/354,200, dated Jun. 1, 2017, 12 pages.
Restriction Requirement for U.S. Appl. No. 15/354,200, dated Apr. 14, 2017, 6 pages.
Restriction Requirement Received for U.S. Appl. No. 13/997,959, dated Aug. 26, 2015, 7 pages.
Restriction Requirement Received for U.S. Appl. No. 13/997,959, dated Feb. 13, 2015, 6 pages.

* cited by examiner

REDUCTION OF POWER CONSUMPTION IN MEMORY DEVICES DURING REFRESH MODES

CROSS-REFERENCE TO RELATED APPLICATIONS

The present application is a divisional of U.S. patent application Ser. No. 15/354,200, filed on Nov. 17, 2016, which is a continuation of U.S. patent application Ser. No. 15/181,358, filed on Jun. 13, 2016, which is a divisional of U.S. patent application Ser. No. 13/997,959, filed on Dec. 19, 2013, which was the National Stage of International Application No. PCT/US2012/030657, filed on Mar. 27, 2012. The entire contents of these applications are incorporated herein by reference.

TECHNICAL FIELD

This disclosure generally relates to the field of integrated circuits and, more particularly, to devices and systems that reduce power usage of memory.

BACKGROUND ART

As electronic and computing devices evolve to provide more functionality and process more content, such devices demand larger storage capacities while, at the same time, increased power efficiency. Given their storage and bandwidth capacities, many electronic and computing devices employ dynamic random access memories (DRAMs) as the working memory of these devices.

Although there are multiple types and variations of DRAMs, most DRAMs require regular or periodic refreshing of the voltage levels in the cells of the DRAMS to retain the corresponding logic data stored therein. This is due to certain parasitic effects and leakage currents in the memory cells of the DRAMs which may, over time, degrade the stored voltage levels. Refresh operations occur during standby periods in which read/write operations to/from the DRAMs are idle. DRAMs typically have a self-refresh mode which, in concert with the standby period, involves turning off internal clocks and input channels while providing a clock enable (CKE) signal, issued by the memory controller, to trigger the self-refresh mode.

However, the increased functionality of electronic and computing devices, as noted above, presents certain challenges in reducing the power consumption of such memory devices.

DETAILED DESCRIPTION

Figure 1:
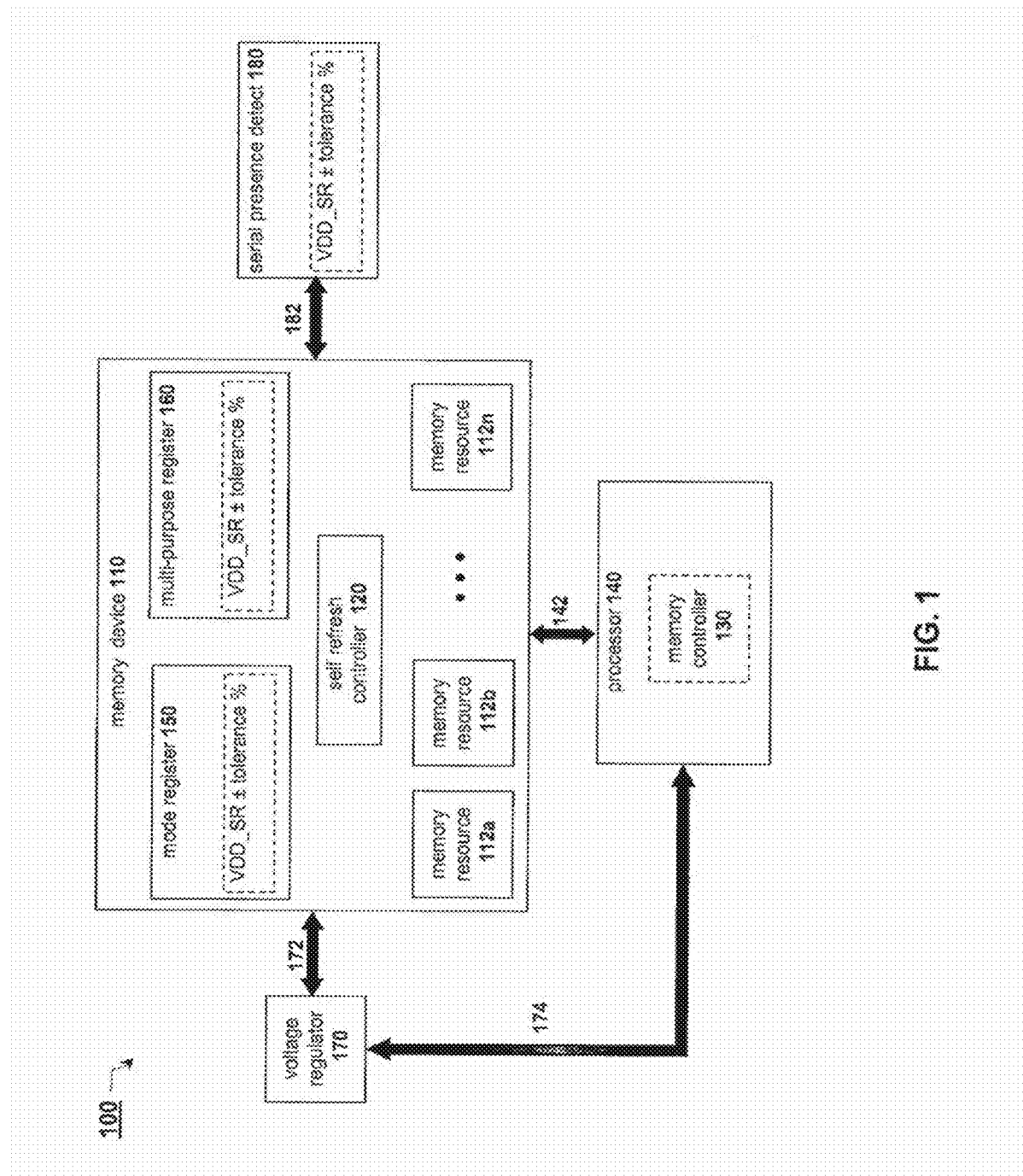
FIG. 1 depicts a high-level functional block diagram of a system configured to reduce power consumption of memory devices during standby modes, in accordance with various aspects of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with various embodiments of this disclosure, what is presented are devices, systems, and methods that include an active mode to accommodate read/write operations of a memory device and a self-refresh mode to accommodate recharging of voltage levels representing stored data when read/write operations are idle. At least one register source provides a first voltage level and a second voltage level that is less than the first voltage level. With such a configuration, during the active mode, the memory device operates at the first voltage level as provided by the at least one register source, and during the self-refresh mode, the memory device operates at the second voltage level as provided by the at least one register source. In this manner, the consumption of power by the memory device is reduced during the self-refresh mode, thereby improving the overall power efficiency of the memory device.

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of claims. As used in the specification and in the claims, the singular form of "a", "an", and "the" include plural referents unless the context clearly dictates otherwise.

Turning attention to the figures, FIG. 1 depicts a high-level functional block diagram of system 100 having a memory device with self-refresh mode capabilities, in accordance with various aspects of the present disclosure. System 100 represents any of a number of electronic and/or computing devices that may include a memory device with a self-refresh mode. Such electronic and/or computing devices may include servers, desktops, laptops, mobile devices, smartphones, gaming devices, tablet computers, networking devices, etc.

In the depicted embodiment, system 100 includes memory device 110, processor 140, memory controller 130, voltage regulator 170, and serial presence detect 180. In alternative embodiments, system 100 may include more components, fewer components, and/or different components. Moreover, although system 100 is depicted as comprising separate elements, it will be appreciated that such elements may be integrated onto one platform.

Memory device 110 provides, at least in part, the main system memory for system 100. Memory device 110 may comprise a DRAM device, such as, for example, DDR1, DDR2, DDR3, DDR4, LPDDR, etc., in accordance with any of the embodiments described herein. Memory device 110 may include one or more memory resources 112a-112n. Memory resources 112a-112n represent the resources on which the data is stored for memory 110, sometimes referred to as the memory array. In different embodiments, the memory resources may be configured as separate memory channels, memory banks, memory groups, etc.

Memory device 110 includes self-refresh (SR) controller 120, which represents hardware and/or software logic within memory 110 to implement self-refresh operations. As mentioned above, self-refresh operations are administered within the memory device itself, which includes SR control 120 to implement the state changes and trigger the self-refresh mode.

Memory device 110 further comprises mode register(s) 150 and multipurpose register 160. Mode register(s) 150 is capable of storing system configuration parameter settings/values, in predefined registers of certain bit lengths, in order to define the capabilities of system 100. Depending on the DRAM type embodied by memory device 110, the stored configuration parameter settings may be programmable i.e., read/writeable or they may be hard-coded i.e., read-only.

In addition, multipurpose register 160 is also capable of storing, among other things, system configuration parameter settings/values that define the capabilities of system 100. The stored configuration parameter settings may be programmable i.e., read/writeable.

System 100 further includes processor 140, which represents the processing resources of system 100. As the processing resource, processor 140 is depicted as being communicatively coupled to memory device 110 via bus infrastructure 142 and voltage regulator 170 via a channel infrastructure 174. It will be appreciated that processor 140 may communicate with other components of system 100, but in the interest of clarity, such communications are omitted without any loss in the understanding of the principles of operation disclosed herein.

It will also be appreciated that, while shown as a singular unit, processor 140 may include one or more processor devices including one or more microprocessors or microcontrollers as well as multi-core processing devices. Processor 140 accesses memory device 110 over a bus infrastructure 142 to perform read and write operations. In some embodiments, bus 142 may also be routed through memory controller 130.

Consistent with various implementations and for the sake of simplicity, memory controller 130 is shown to be integrated with processor 140, in accordance with an embodiment of the present disclosure. However, it should be appreciated that, depending on certain implementations, memory controller 130 may not be integrated with processor 140 and may be communicatively coupled to processor 140 via a bus infrastructure.

Memory controller 130 is configured with logic (hardware and/or software) to control access to memory device 110. Additionally, memory controller 130 includes logic to generate the self-refresh operations. As depicted, memory controller 130 accesses memory device 110 via bus infrastructure 142 and is capable of providing a clock enable (CKE) signal to memory device 110, which indicates a transition to self-refresh mode.

As noted above, processor 140 communicates with voltage regulator 170 via channel 174. The circuitry of voltage regulator 170 is configured to regulate a received voltage from a power supply to output a constant DC voltage signal level commensurate with the voltage requirements of system 100 components, such as, memory device 110, processor 140, memory controller 130, etc. As illustrated in FIG. 1, the regulated output voltage is supplied to memory device 110 via a supply line infrastructure 172, i.e., voltage rail.

System 100 also includes a serial presence detect (SPD) module 180. The SPD 180 typically comprises an EEPROM device coupled to the DIMM of memory device 110 that stores operational information of system 100 to the BIOS. The operational information is stored in read-only form and during the BIOS process such information may be supplied to other system 100 components, such as, memory controller 130, memory device 110, mode register(s) 150, and multipurpose register 160.

As noted above, during standby periods in which read/write operations to/from the DRAMs are inactive or idle, the DRAMs may enter into a self-refresh mode. During the self-refresh mode, the voltage levels of the DRAM cells are refreshed or recharged to retain the corresponding logic data stored therein. However, refreshing operations draw less current than active read/write operations. As such, the voltages supplied to DRAMs during self-refresh modes may be reduced, which results in the overall memory power usage efficiency.

For example, in a non-limiting embodiment, memory device 110 of system 100 may be configured as a dual data rate DRAM device, such as, DDR4. Typically, for both active and standby modes (including the self-refresh mode), DDR4 DRAMs require a regulated voltage Vdd of 1.2V with a tolerance range of +/−5%. However, the current required to drive refreshing operations during the self-refresh mode is less than the current required during active read/write operations. As such, an opportunity exists to reduce or lower the regulated voltage level supplied by voltage regulator 170 to memory device 110 during the self-refresh mode, without compromising data retention.

So, for the non-limiting embodiment in which memory device 110 comprises a DDR4 DRAM, depending on manufacturer specifications, memory device 110 may be supplied with a regulated voltage during self-refresh mode (VDD_SR) of 1.1V or 1.0V. Equally notable, the tolerance range of VDD_SR may also be refined depending, again, on manufacturer specifications. For example, under one specification, memory device 110 may be supplied with a VDD_SR of 1.0V with a tolerance range of +/−4.0% while under another specification, memory device 110 may be supplied with a VDD_SR of 0.98V with a tolerance range of +/−3.0%. It should be appreciated, however, that while the VDD_SR and refined tolerance values disclosed above may be representative, they are not intended to be limiting in any way.

With this said, VDD_SR and refined tolerance values may be implemented in system 100 by exploiting existing register resources that store operational and/or configuration setting information. In particular, depending on the DRAM type embodied by memory device 110, certain associated register resources may enable the provision of VDD_SR and refined tolerance values.

For example, in certain non-limiting embodiments, multipurpose register 160, which stores system configuration parameter settings, may be used to specify VDD_SR and refined tolerance values for DDR4 DRAMs. In other embodiments, mode register 150, which also stores system configuration parameter settings may be used to specify VDD_SR and refined tolerance values for LPDDR DRAMs. In yet other embodiments, SPD module 180, which stores operational information, may also be used to provide VDD_SR and refined tolerance values.

With such a configuration, the VDD_SR and/or refined tolerance values may be read from the register resources, namely, mode register 150, multipurpose register 160, and SPD module 180, and supplied to voltage regulator 130 during, for example, the BIOS process, to provide the lower voltage and tighter tolerance value during the self-refresh mode. In so doing, the consumption of power is reduced during self-refresh mode, thereby improving the overall power efficiency of memory device 110.

Figure 2:
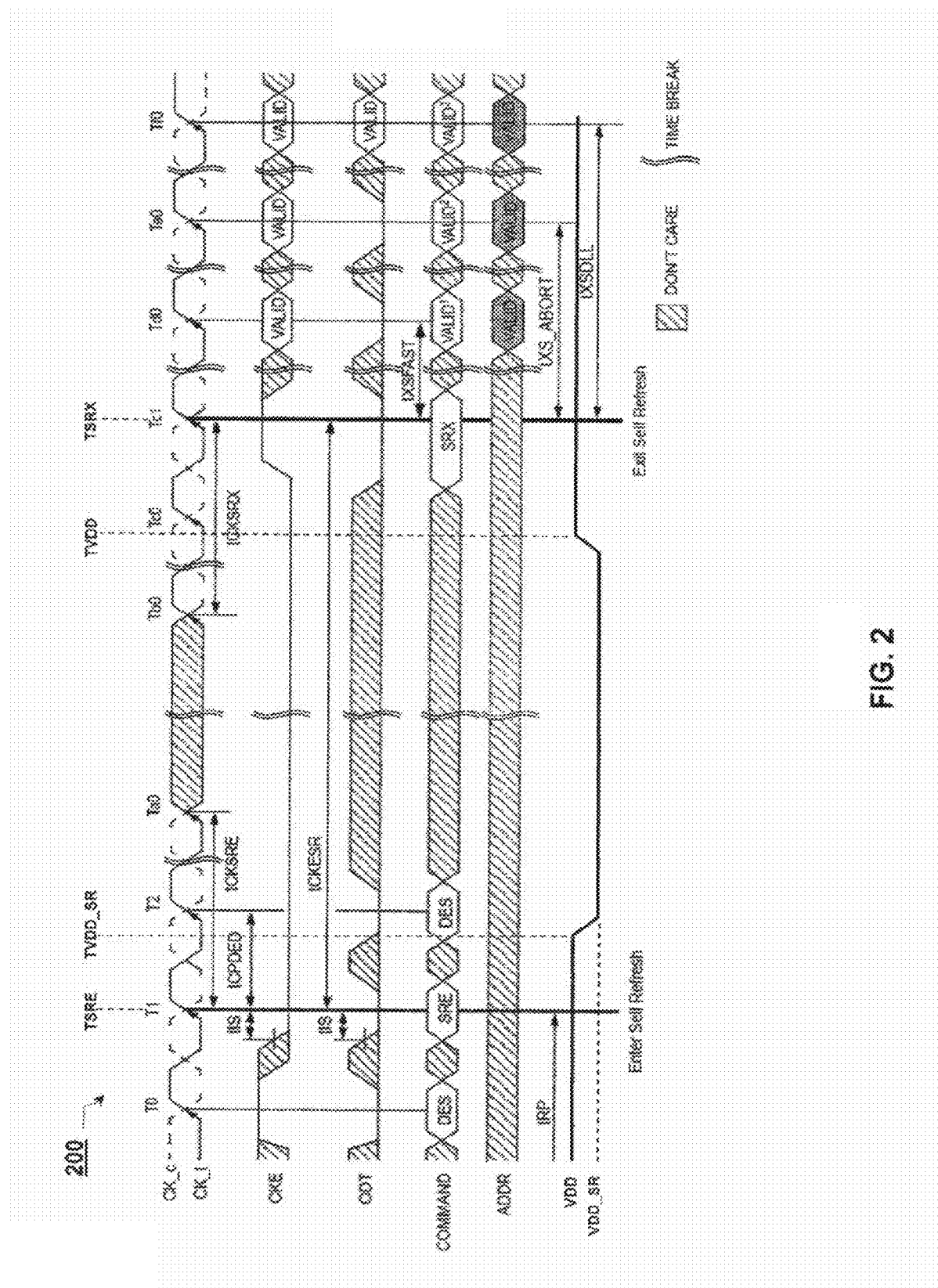
FIG. 2 depicts a timing diagram representing reduction in power consumption of memory devices, in accordance with various aspects of the present disclosure.

By way of illustration, FIG. 2 depicts timing diagram 200, which 200 illustrates the timing and triggering events for various signals memory device 110 signals, in accordance with various aspects of the present disclosure. In keeping with the non-limiting example noted above for clarity, memory device 110 may comprise a DDR4 DRAM device capable of executing a self-refresh mode.

As illustrated in FIG. 2, differential clock signals (CK_t, CK_c), which provide the overall timing of system 100, are shown with certain timing points, such as, T0, T1, T2 . . . Ta0, Tb0 . . . Tf0, TSRE, TSRX, TVDD, and TVDD_SR. Clock enable (CKE) is the unidirectional signal provided by memory controller 130 to trigger memory device 110 to enter self-refresh mode.

As shown, a deselect command (DES) signal is issued at T0, indicating no ensuing active read/write operations for memory device 110; in other words, memory device 110 is to be in standby mode. As such, in accordance with the CKE signal transitioning to a low level at timing T1 and a self-refresh enable (SRE) command at timing T1, memory device 110 enters into self-refresh mode shortly thereafter at timing TSRE with a self refresh enable clock count (tCKSRE).

After a certain number of clock cycles post SRE command, at timing TVDD_SR, voltage regulator 170 switches the regulated voltage supplied to memory device 110 from the VDD voltage to the lower VDD_SR voltage specified by the register resources. Consistent with the principles described above, VDD is the voltage signal level for active read/write operations, for example, in the case of DDR4 DRAM, VDD=1.2V; while VDD_SR is the voltage signal level that is lower than VDD and still capable of supporting refreshing operations during the self-refresh mode, for example, VDD_SR=1.0V.

Moreover, in some embodiments, the switching of voltage signal levels by voltage regulator 170 may be accomplished by adjusting voltage regulator 170 to output the lower VDD_SR voltage. In other embodiments, voltage regulator 170 may provide two voltage signal lines (i.e., voltage rails), one supplying VDD and the other supplying lower VDD_SR. In this manner, the switching of voltage signal levels may be achieved by having voltage regulator 170 toggle between the two voltage rails.

Memory device 110 will execute refresh operations at the lower voltage level VDD_SR and will continue to do so, until just prior to exiting self-refresh mode, noted as timing TVDD. That is, to prevent any potential risk of data loss within memory device 110, prior to exiting the self-refresh mode, a self-refresh exit clock count (tCKSRX) is generated internal to memory controller 130. It is during the tCKSRX clock count that a self-refresh exit (SRX) command and the CKE signal of memory controller 130 transitions to a high level, both indicating the approaching end of the self-refresh mode. Therefore, as shown in FIG. 2 at timing TVDD, within the tCKSRX clock count in which the SRX command issues and the CKE signal transitions, voltage regulator 170 switches the regulated voltage supplied to memory device 110 back to VDD, prior to the exit of the self-refresh mode at TSRX.

As such, the consumption of power is reduced during self-refresh mode, thereby improving the overall power efficiency of memory device 110.

Having thus described the novel concepts and principles of the optimization of carrier recovery performance, it will be apparent to those skilled in the art after reading this detailed disclosure that the foregoing detailed disclosure is intended to be presented by way of example only and is not limiting. Various alterations, improvements, and modifications will occur and are intended to those skilled in the art, though not expressly stated herein. The alterations, improvements, and modifications are intended to be suggested by this disclosure, and are within the spirit and scope of the exemplary aspects of this disclosure. Additionally, the recited order of processing elements or sequences, or the use of numbers, letters, or other designations therefore, is not intended to limit the claimed processes and methods to any order except as can be specified in the claims. Although the above disclosure discusses through various examples what is currently considered to be a variety of useful aspects of the disclosure, it is to be understood that such detail is solely for that purpose, and that the appended claims are not limited to the disclosed aspects, but, on the contrary, are intended to cover modifications and equivalent arrangements that are within the spirit and scope of the disclosed aspects.

What is claimed is:

1. A system comprising:
   a processor; and
   a memory controller communicatively coupled with the processor and a memory device, wherein the memory controller comprises hardware logic to control access to the memory device, including to transmit a command to the memory device to program a register to indicate one of multiple voltage rails for the memory device;
   wherein, based at least in part on the register, the memory device is to:
      operate from a first voltage rail in a first mode, wherein the first voltage rail is to provide a first DC voltage at a first magnitude, and wherein the first mode is to accommodate read and write operations; and
      operate from a second voltage rail in a second mode based at least in part on a register, wherein the second voltage rail is to provide a second DC voltage at a second magnitude that is lower than the first magnitude, and wherein the memory device is to perform self-refresh in the second mode.

2. The system of claim 1, wherein:
   the memory device is to operate from a higher voltage rail in the first mode and operate from a lower voltage rail in the second mode based at least in part on the register and based at least in part on a transition to the second mode.

3. The system of claim 2, wherein:
   the hardware logic of the memory controller is to further trigger the transition of the memory device into the second mode.

4. The system of claim 3, wherein
   the hardware logic to trigger the transition to the second mode is to:
   issue a deselect (DES) command to indicate no active read/write operations for the memory device,
   transition a clock enable signal low, and
   issue self-refresh enable (SRE) command to memory device.

5. The system of claim 3, wherein:
   the memory controller is to cause a transition to the second mode.

6. The system of claim 5, wherein:
   the memory controller to cause the transition to the second mode is to:
   issue a deselect (DES) command to indicate no active read/write operations for the memory device,
   transition a clock enable signal low, and
   issue self-refresh enable (SRE) command to memory device.

7. The system of claim 1, wherein the processor includes the memory controller.

8. The system of claim 1, wherein:
the hardware logic is to control access to the memory device in accordance with a DDR (double data rate) standard.

9. The system of claim 1, wherein:
the hardware logic is to control access to the memory device in accordance with an LPDDR (low power double data rate) standard.

10. The system of claim 1, wherein:
the hardware logic is to provide a clock enable signal to the memory device, the clock enable signal to trigger entry into the second mode.

11. A system comprising:
a memory controller to control access to a memory device, including to transmit a command to the memory device to program a register to indicate one of multiple voltage rails for the memory device; and
a voltage regulator to supply regulated output voltages to the memory device via a supply line infrastructure, wherein the supply line infrastructure comprises a first voltage rail to provide a first DC voltage at a first magnitude and a second voltage rail to provide a second DC voltage at a second magnitude that is lower than the first magnitude;
wherein, based at least in part on the register, the memory device is to:
operate from the first voltage rail in a first mode, wherein the first mode is to accommodate read and write operations; and
operate from a second voltage rail in a second mode based at least in part on a register, wherein the memory device is to perform self-refresh in the second mode.

12. The system of claim 11, wherein:
the memory device is to operate from a higher voltage rail in the first mode and operate from a lower voltage rail in the second mode based at least in part on the register and based at least in part on a transition to the second mode.

13. The system of claim 12, further comprising:
a power supply to provide a voltage to the voltage regulator.

14. The system of claim 11, wherein:
the memory controller is to control access to the memory device in accordance with a DDR (double data rate) standard.

15. The system of claim 11, wherein:
the memory controller is to control access to the memory device in accordance with an LPDDR (low power double data rate) standard.

16. The system of claim 11, wherein:
the memory controller is to provide a clock enable signal to the memory device, the clock enable signal to trigger entry into the second mode.

17. A memory controller comprising:
first hardware logic to control access to a memory device, including to transmit a command to the memory device to program a register to indicate one of multiple voltage rails for the memory device; and
second hardware logic to provide a clock enable signal to the memory device, the clock enable signal to trigger entry into a self-refresh mode;
wherein, based at least in part on the register, the memory device is to:
operate from a first voltage rail in an active mode, wherein the first voltage rail is to provide a first DC voltage at a first magnitude; and
operate from a second voltage rail in the self-refresh mode based at least in part on a register, wherein the second voltage rail is to provide a second DC voltage at a second magnitude that is lower than the first magnitude.

18. The memory controller of claim 17, wherein:
the memory device is to operate from a higher voltage rail in the active mode and operate from a lower voltage rail in the self-refresh mode based at least in part on the register and based at least in part on the entry into the self-refresh mode.

19. The memory controller of claim 17, wherein:
the first and second hardware logic is to control access to the memory device in accordance with a DDR (double data rate) standard.

20. The memory controller of claim 17, wherein:
the first and second hardware logic is to control access to the memory device in accordance with an LPDDR (low power double data rate) standard.

* * * * *